United States Patent
Sander

(10) Patent No.: US 6,737,856 B2
(45) Date of Patent: May 18, 2004

(54) CIRCUIT CONFIGURATION FOR DETECTING THE CURRENT IN A LOAD TRANSISTOR

(75) Inventor: Rainald Sander, München (DE)

(73) Assignee: Infineon Technologies AG, Munich (DE)

( * ) Notice: Subject to any disclaimer, the term of this patent is extended or adjusted under 35 U.S.C. 154(b) by 72 days.

(21) Appl. No.: 09/943,589

(22) Filed: Aug. 30, 2001

(65) Prior Publication Data

US 2002/0024376 A1 Feb. 28, 2002

(30) Foreign Application Priority Data

Aug. 30, 2000 (DE) .......................................... 100 42 585

(51) Int. Cl.⁷ .............................. G01R 31/02; G05F 3/16
(52) U.S. Cl. ................... 324/158.1; 324/765; 324/763; 323/315
(58) Field of Search ................................ 324/765, 763, 324/158.1, 72; 323/315, 312; 327/535, 538, 546; 365/185.21, 189.05

(56) References Cited

U.S. PATENT DOCUMENTS

| | | | |
|---|---|---|---|
| 4,560,921 A | * 12/1985 | Yamatake | 323/316 |
| 4,789,825 A | * 12/1988 | Carelli et al. | 324/765 |
| 4,820,968 A | * 4/1989 | Wrathall | 323/316 |
| 5,144,514 A | 9/1992 | Sekigawa et al. | |
| 5,375,029 A | 12/1994 | Fukunaga et al. | |
| 5,543,632 A | * 8/1996 | Ashley | 257/48 |
| 5,808,508 A | * 9/1998 | Castellucci et al. | 327/538 |
| 5,874,830 A | * 2/1999 | Baker | 323/316 |
| 5,909,142 A | * 6/1999 | Kawasaki et al. | 327/543 |
| 6,114,844 A | * 9/2000 | Chang et al. | 323/281 |
| 6,140,928 A | * 10/2000 | Shibuya et al. | 340/636 |
| 6,392,392 B1 | * 5/2002 | Nakahara | 323/312 |
| 2002/0024376 A1 | 2/2002 | Sander | |

FOREIGN PATENT DOCUMENTS

| | | | |
|---|---|---|---|
| DE | 40 20 187 C2 | 1/1991 | |
| DE | 43 34 386 A1 | 4/1994 | |
| DE | 100 42 585 C1 | 11/2002 | |
| JP | 02-136029 | * 5/1990 | H02H/9/02 |
| JP | 00 235 424 A | 8/2000 | |

* cited by examiner

Primary Examiner—Kamand Cuneo
Assistant Examiner—Paresh Patel
(74) Attorney, Agent, or Firm—Laurence A. Greenberg; Werner H. Stemer; Ralph E. Locher

(57) ABSTRACT

The present invention relates to a circuit arrangement having a load transistor (T1) and a current sensing transistor (T2) coupled to the load transistor (T1), wherein a switch arrangement (S) having at least one first switch (S1; S1a, S1b) is connected downstream of the current sensing transistor (T2) in order to connect the current sensing transistor (T2) to a first or second evaluation circuit (BL1, BL2) depending on a control signal.

17 Claims, 3 Drawing Sheets

CIRCUIT CONFIGURATION FOR DETECTING THE CURRENT IN A LOAD TRANSISTOR

BACKGROUND OF THE INVENTION

Field of the Invention

The present invention relates to a circuit arrangement having a load transistor and a current sensing transistor coupled to the load transistor.

In order to detect the current through a load transistor which serves for switching a load, it is known to connect in parallel with the load transistor a transistor as a current sensing transistor which is operated with the same operating point as the load transistor. FIG. 1 shows such a circuit arrangement, also referred to as a current sense arrangement, according to the prior art.

The circuit arrangement has a load transistor T1S, which is connected up in series with a load Z1S between a supply potential Vdd and a reference-ground potential GND. Arranged in parallel with the load transistor T1S is a current sensing transistor T2S, whose gate terminal is connected to the gate terminal of the load transistor T1S and whose drain terminal together with the drain terminal of the load transistor T1S is connected to a supply potential Vdd. A series circuit comprising a transistor T3S and a current sensing resistor Z2S is connected downstream of the source terminal of the current sensing transistor T2S. In this case, the transistor T3S is driven by means of a comparator K1S, which compares the source potentials of the load transistor T1S and of the current sensing transistor T2S with one another in order to set them to the same value. The current I2 through the current sensing transistor T2S is then proportional to the current I1 through the load transistor T1S, the ratio of these two currents depending on the ratio of the dimensions of the load transistor T1S and of the current sensing transistor T2S.

It is also known for a current supplied by a current sensing transistor in accordance with FIG. 1 to be fed to different application circuits than that illustrated in FIG. 1. In this case, in known circuit arrangements, a dedicated current sensing transistor is provided for each of the evaluation circuits.

The load transistor and the associated current sensing transistor are usually integrated in a chip, while evaluation circuits are integrated in a further chip. In this case, a line connection is required between each of the current sensing transistors in one chip and the associated processing circuit in the other chip, which means that each of these connections requires a contact pin on the first and second chips.

SUMMARY OF THE INVENTION

It is an aim of the present invention to provide a circuit arrangement for evaluating the load current of a load transistor which can be realized simply with known circuit means and in which, in particular, the abovementioned disadvantages do not occur.

The circuit arrangement according to the invention has a load transistor and a current sensing transistor coupled to the load transistor, wherein a switch arrangement having at least one first switch is connected downstream of the current sensing transistor in order to connect the current sensing transistor to a first or second evaluation circuit depending on a control signal.

The circuit arrangement according to the invention requires only one current sensing transistor, whose output current can be fed via the switch arrangement as required to one of the evaluation circuits.

In accordance with one embodiment of the invention, it is provided that the switch arrangement can be driven depending on a load path voltage (drain-source voltage) of the load transistor. It is thus possible to provide, as an evaluation circuit, circuit components which supplement the current sensing resistor to form a conventional current sense circuit according to FIG. 1, the current of the current sensing resistor being fed to this evaluation circuit only until a predetermined drain-source voltage of the load transistor is reached. Conventional current sense circuits supply a current signal which is proportional to the load current only when the load transistor is not yet in saturation, in other words when the drain-source voltage is below a saturation voltage. By means of the circuit arrangement according to the invention, the current of the current sensing resistor can be fed to another evaluation circuit when the drain-source voltage reaches the value of the saturation voltage and the current of the current sensing resistor can no longer be suitably evaluated anyway in the current sense arrangement.

In accordance with a further embodiment of the invention, it is provided that the load transistor and the current sensing transistor are integrated in a first chip, and that the switch arrangement and the first and second evaluation circuits are integrated in a second chip. In this embodiment of the invention, only one line connection is required between the first chip and the second chip in order to be able to feed the load current of the current sensing resistor to the evaluation circuits.

DESCRIPTION OF THE PREFERRED EMBODIMENTS

In the figures, unless specified otherwise, identical reference symbols designate identical structural parts with the same meaning.

Figure 1:
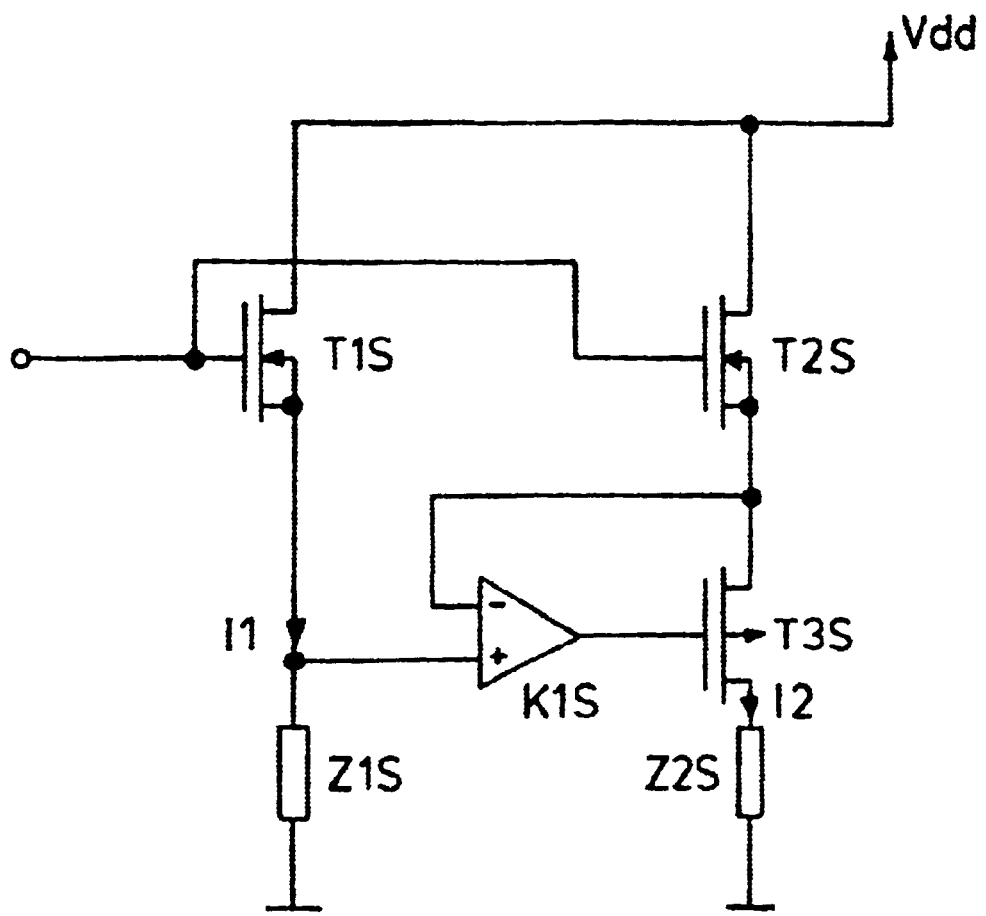
FIG. 1 shows a current sense arrangement according to the prior art.
Figure 2:
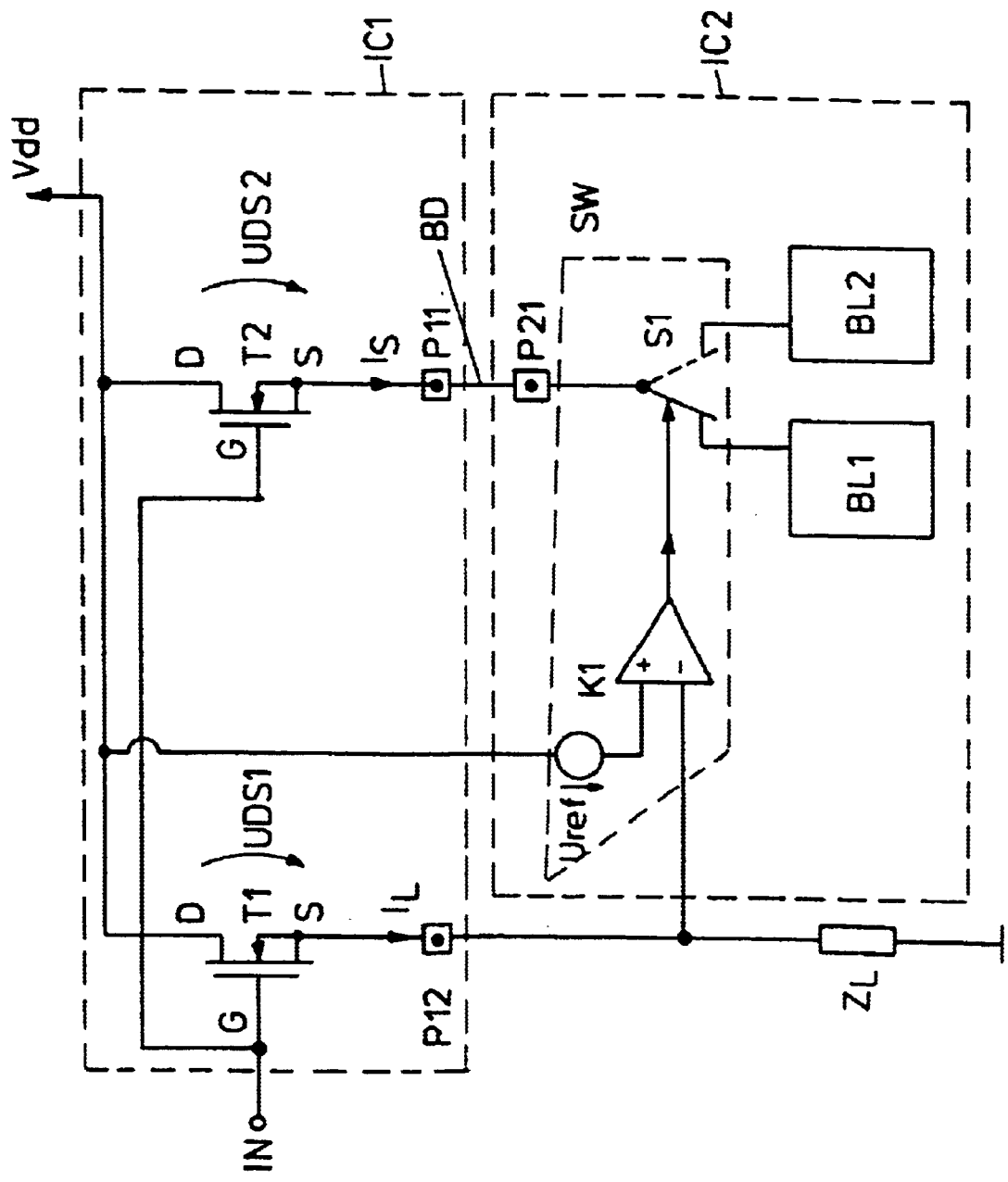
FIG. 2 shows a circuit arrangement according to the invention in accordance with one embodiment of the invention.

FIG. 2 shows an exemplary embodiment of the circuit arrangement according to the invention. The circuit arrangement has a load transistor T1 and a current sensing transistor T2, which are designed as n-channel MOS transistors in the exemplary embodiment. A drain terminal D of the load transistor T1 and a drain terminal D of the current sensing transistor T2 are connected to a supply potential Vdd. A gate terminal of the load transistor T1 and a gate terminal of the current sensing transistor T2 are jointly connected to an input terminal IN for feeding in a drive signal, according to which the load transistor (and the current sensing transistor) turns on or turns off. The load transistor T1 and the current sensing transistor T2 are preferably integrated in a semiconductor body which has a multiplicity of identically constructed transistor cells, some of the transistor cells (usually the majority) being connected to one another in order to form the load transistor T1 and some of the transistor cells (usually a small portion) being connected to one another in order to form the current sensing transistor T2. A load $Z_L$ is connected between a source terminal S of the load transistor T1 and a reference-ground potential GND, which load is driven by means of the load transistor T1. The source terminal S of the current sensing transistor T2 is connected to a switch arrangement SW, which connects the source terminal S to a first or a second evaluation unit BL1, BL2 depending on a switch position of a switch S1. This switch arrangement SW has a first comparator K1 as comparator unit, one of whose terminals is connected to the source terminal S of the load transistor T1 and whose other terminal is connected to the supply potential Vdd via a reference voltage source Uref.

An output signal of the comparator K1 assumes an upper drive level if a drain-source voltage UDS1 across the drain-source path D-S of the load transistor T1 is greater than the reference voltage Uref, and the output signal AS assumes a lower drive level if the drain-source voltage UDS1 is less than the reference voltage Uref. The switch S1 driven by the drive signal AS connects the first evaluation circuit BL1 or the second evaluation circuit BL2, depending on the level of the drive signal AS, to the source terminal S of the current sensing transistor T2 in order to feed the load current of the current sensing transistor T2 to the first or second evaluation circuit.

The load transistor T1 and the current sensing transistor T2 are preferably integrated in a first chip IC1, while the switch arrangement S and the drive circuits BL1, BL2 are preferably integrated in a second chip IC2. The load current $I_s$ of the current sensing transistor T2 is available at a first terminal pin P11 of the first chip IC1 and is fed to the second chip IC2 via a terminal pin P21. In this case, the terminal pins P11, P21 are connected to one another by means of a bonding wire BD. The usually external load $Z_L$ is connected to a second terminal pin P12 of the first chip IC1. In this case, the second input of the comparator K1 can likewise be connected to said second terminal pin P12, and so this does not require a separate connection between the first chip IC1 and the second chip IC2. The second chip IC2 has a dedicated terminal pin (not specifically illustrated) for the supply potential Vdd, and so the first terminal of the comparator K1 does not have to be connected via the reference voltage source Uref to the supply potential Vdd in the first chip IC1, which is illustrated in this way in FIG. 2 merely for reasons of clarity.

Figure 3:
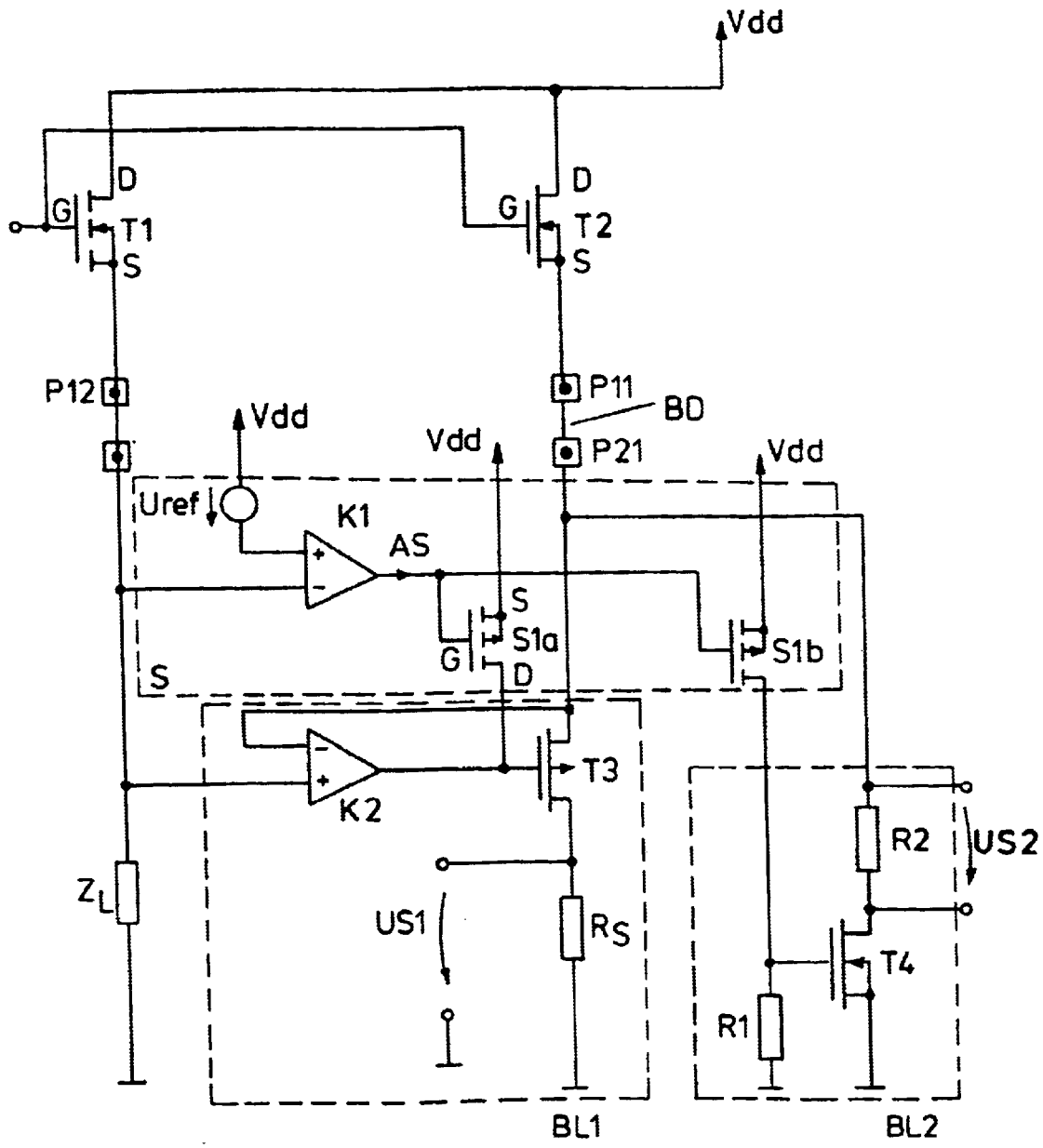
FIG. 3 shows a circuit arrangement according to the invention in accordance with FIG. 2 with a detailed illustration of the switch arrangement and of an exemplary embodiment of the first and second processing units.

FIG. 3 shows an exemplary embodiment of the circuit arrangement according to the invention, in which an exemplary embodiment of the construction of the first evaluation circuit BL1 and of the second evaluation circuit BL2 is respectively illustrated.

The first evaluation circuit BL1 supplements the current sensing transistor T2 in the example to form a current sense circuit. The evaluation circuit BL1 has a regulating transistor T3 which is connected in series with the current sensing transistor T2 via the terminal pins P21, P11 of the first and second chips IC1, IC2. A current sensing resistor Rs is connected between the regulating transistor T3 and reference-ground potential GND. The regulating transistor T3, which is designed as a p-channel transistor in the exemplary embodiment, is driven by a second comparator K2, whose first input (inverting input) is connected to the terminal pin P21 of the second chip IC2 and to the source terminal S of the current sensing transistor T2. A second input (noninverting input) of the second comparator K2 is connected to the second pin P12 of the first chip IC1 and to the source terminal S of the load transistor T1. The second comparator K2 regulates the resistance of the drain-source path of the regulating transistor T3 in such a way that the source potential of the load transistor T1 and the source potential of the current sensing transistor T2 correspond, with the result that the load transistor T1 and the current sensing transistor T2 are operated with the same operating point. The load current I, of the current sensing transistor T2 is then proportional to the load current $I_L$ of the load transistor T1.

A voltage signal or current signal Us1 can be tapped off at the current sensing resistor RS, which voltage signal is proportional to the current sense current $I_s$ or the load current $I_L$ of the load transistor T1.

The switch arrangement S in accordance with FIG. 3 has, in addition to the comparator K1, first and second transistors S1a, S1b which are designed as p-channel transistors and whose gate terminals G are connected to the output of the comparator K1. Source terminals S of the first and second transistors S1a, S1b are connected to the supply potential Vdd. The drain terminal of the first transistor S1a is connected to the gate G of the regulating transistor T3. If the first transistor S1a turns off, then the arrangement comprising the comparator K2, the transistor T3 and the current sensing resistor RS functions in the manner described above. If the first transistor S1a turns on, then the gate of the third transistor T3 is connected to supply potential Vdd, as a result of which the third transistor T3 turns off, so that the load current $I_s$ no longer flows through the current sensing resistor RS and the current signal Us1 falls to zero. The first transistor S1a and the second transistor S1b are in the on state as long as the drain-source voltage UDS1 of the load transistor T1 is less than the reference voltage Uref.

Current sense arrangements like those produced from the circuit arrangement of the evaluation circuit BL1 according to figure 3 and the current sensing resistor T2 function with sufficient accuracy, that is to say supply a voltage signal or current signal Us1 which is proportional to the load current $I_L$ only when the load transistor T1 is not yet in saturation, in other words as long as the load current $I_L$ rises proportionally to the drain-source voltage UDS1.

If the drain-source voltage UDS1 of the load transistor T1 exceeds the value of the reference voltage Uref, which is preferably chosen such that it is less than the saturation voltage of the load transistor T1, then the load current $I_s$ can be switched over to the second evaluation circuit by means of the switch arrangement SW. This ensures that a current signal Us1 is generated by the first evaluation circuit BL1 only as long as the load transistor T1 is not yet in saturation and as long as the current sense arrangement can supply a signal Us1 which is proportional to the load current of the load transistor T1.

The second evaluation circuit BL2 has a series circuit comprising a resistor R2 and an n-channel transistor T4, this series circuit likewise being connected to the terminal pin P21 of the second chip IC2. The gate terminal G of the transistor T4 is connected to the source terminal of the transistor S1b of the switch arrangement and connected to reference-ground potential GND via a resistor R1. If the second transistor S1b turns on, then approximately the entire supply voltage Vdd is present across the resistor R1, as a result of which the transistor T4 turns on. The transistor T4 turns off if the second transistor S1b also turns off. The fourth transistor T4 thus turns on when the regulating transistor T3 turns off and the fourth transistor T4 turns off when the regulating transistor T3 turns on. This ensures that the load current $I_s$ of the current sensing resistor T2 flows either only into the first evaluation circuit BL1 or only into the second evaluation circuit BL2.

The first evaluation circuit BL1 supplies a signal Us1 proportional to the load current $L_L$ as long as the load transistor T1 is not yet in saturation or as long as the drain-source voltage UDS1 is less than the reference voltage ref. If the drain-source voltage UDS1 exceeds the reference voltage Uref, then the load current $I_s$ of the current sensing transistor T2 flows into the second evaluation circuit BL2, where this load current $I_s$ generates across the second resistor R2 a voltage drop which can be used as second current signal Us2 for setting the drive voltage (gate-source voltage) of the load transistor T1. The load current of the load transistor T1 and thus also the load current of the current sensing transistor T2 are greatly dependent on the gate-source voltage in the saturation region. Depending on the load current of the current sensing resistor T2, the gate-source voltage of the load transistor can then be set by way of the current signal Us2. The second drive circuit BL2 may be used, in particular, as part of a current limiting circuit which reduces the gate-source voltage of the load transistor T1 if the load current exceeds a predetermined value, which can be determined from the voltage signal Us2.

What is claimed is:

1. A circuit configuration, comprising:
   a load transistor having a load path and a voltage across said load path;
   a current sensing transistor coupled to said load transistor;
   a first evaluation circuit;
   a second evaluation circuit; and
   a switch configuration for receiving a control signal, said switch configuration including at least one switch driven depending on the voltage across said load path of said load transistor and connected downstream of said current sensing transistor, said switch configuration connecting said current sensing transistor to a selected evaluation circuit selected from the group consisting of said first evaluation circuit and said second evaluation circuit in dependence on said control signal.

2. The circuit configuration according to claim 1, wherein:
   said current sensing transistor provides an output current; and
   said switch configuration feeds the output current of said current sensing transistor to said selected evaluation circuit.

3. The circuit configuration according to claim 1, wherein:
   said current sensing transistor provides an output current; and
   said switch configuration feeds the output current of said current sensing transistor to said selected evaluation circuit.

4. The circuit configuration according to claim 1, comprising:
   a first chip having said load transistor and said current sensing transistor integrated therein; and
   a second chip having said switch configuration, said first evaluation circuit, and said second evaluation circuit integrated therein.

5. The circuit configuration according to claim 1, wherein:
   said load transistor has a load path and a voltage across said load path;
   said switch configuration has a comparator configuration that receives a reference voltage; and
   said comparator configuration compares the voltage across said load path of said load transistor with the reference voltage.

6. The circuit configuration according to claim 5, wherein:
   said comparator configuration provides an output signal; and
   said switch is driven in dependence on the output signal of said comparator configuration.

7. The circuit configuration according to claim 1, wherein said switch has a first transistor configured to be driven in dependence on an output signal of a comparator configuration and to control a to be regulated resistor in a first evaluation circuit.

8. The circuit configuration according to claim 1, wherein:
   said first evaluation circuit includes a regulatable resistor connected in series with said current sensing transistor; and said first evaluation circuit includes a comparator configuration regulating said regulatable resistor.

9. The circuit configuration according to claim 8, wherein:
   said first evaluation circuit includes a further resistor connected in series with said regulatable resistor; and
   a first current signal can be tapped off at said further resistor.

10. The circuit configuration according to claim 9, wherein said regulatable resistor is designed as a transistor.

11. The circuit configuration according to claim 8, wherein said regulatable resistor is designed as a transistor.

12. The circuit configuration according to claim 1, wherein:
    said second evaluation circuit has a series circuit; and
    said series circuit includes a resistor and a switch connected in series with said current sensing transistor.

13. The circuit configuration according to claim 12, wherein:
    said switch configuration has a switch position; and
    said switch of said series circuit of said second evaluation circuit is driven in dependence on the switch position of said switch configuration.

14. The circuit configuration according to claim 1, comprising:
    a terminal for receiving a supply potential;
    said comparator configuration providing an output signal;
    said switch having a first transistor and a second transistor being driven in dependence on the output signal of said comparator configuration;
    said second evaluation circuit including a series circuit;
    said series circuit including a resistor and a switch connected in series with said current sensing transistor;
    said switch of said series circuit including a control terminal;
    said second transistor including a load path connected between the supply potential and said control terminal of said switch of said series circuit.

15. The circuit configuration according to claim 10, wherein said switch has a first transistor configured to be driven in dependence on an output signal of said comparator configuration and to control said regulatable resistor.

16. The circuit configuration according to claim 12, wherein said switch has a second transistor configured to be driven in dependence on an output signal of a comparator configuration and to control said switch.

17. A circuit configuration comprising:
    a load transistor;
    a current sensing transistor coupled to said load transistor;
    a first evaluation circuit;
    a second evaluation circuit;
    a terminal for receiving a supply potential;
    a comparator configuration providing an output signal;
    a switch configuration for receiving a control signal, said switch configuration including at least one switch connected downstream of said current sensing transistor, said switch configuration connecting said current sensing transistor to a selected evaluation circuit selected from the group consisting of said first evaluation circuit and said second evaluation circuit in dependence on said control signal;
    said switch having a first transistor and a second transistor being driven in dependence on the output signal of said comparator configuration;

said first evaluation circuit including a regulatable resistor connected in series with said current sensing transistor;

said first evaluation circuit including said comparator configuration regulating said regulatable resistor;

said regulatable resistor including a control terminal; and said first transistor including a load path connected between said terminal for receiving the supply potential and said control terminal of said regulatable resistor.

* * * * *